US010283465B2

(12) United States Patent
Keeton et al.

(10) Patent No.: US 10,283,465 B2
(45) Date of Patent: May 7, 2019

(54) THREE TERMINAL SOLID STATE PLASMA MONOLITHIC MICROWAVE INTEGRATED CIRCUIT

(71) Applicant: Plasma Antennas Limited, Lymington (GB)

(72) Inventors: Richard Brooke Keeton, Lymington (GB); Ruth Elizabeth Harper, Didcot (GB); David Hayes, St. Ives (GB)

(73) Assignee: Plasma Antennas Limited, Lymington (GB)

( * ) Notice: Subject to any disclaimer, the term of this patent is extended or adjusted under 35 U.S.C. 154(b) by 0 days.

(21) Appl. No.: 16/065,939

(22) PCT Filed: Nov. 28, 2016

(86) PCT No.: PCT/GB2016/000210
§ 371 (c)(1),
(2) Date: Jun. 25, 2018

(87) PCT Pub. No.: WO2017/121975
PCT Pub. Date: Jul. 20, 2017

(65) Prior Publication Data
US 2019/0019768 A1   Jan. 17, 2019

(30) Foreign Application Priority Data
Jan. 15, 2016   (GB) .................... 1600939.1

(51) Int. Cl.
*H01L 23/52*       (2006.01)
*H01L 23/66*       (2006.01)
(Continued)

(52) U.S. Cl.
CPC ............. *H01L 23/66* (2013.01); *H01L 21/56* (2013.01); *H01L 27/0814* (2013.01); *H01P 1/15* (2013.01);
(Continued)

(58) Field of Classification Search
CPC ................. H01L 23/66; H01L 27/0814; H01L 2224/16227
See application file for complete search history.

(56) References Cited

U.S. PATENT DOCUMENTS 5,127,102 A * 6/1992 Russell ................ H03D 9/0633
455/327
5,561,073 A   10/1996 Jerome et al.
(Continued)

FOREIGN PATENT DOCUMENTS

WO   03056660 A1   7/2003

*Primary Examiner* — Nicholas J Tobergte
(74) *Attorney, Agent, or Firm* — Iandiorio Teska & Coleman, LLP

(57) ABSTRACT

A solid state plasma monolithic microwave integrated circuit having single or multiple elemental devices with at least three terminals operating within the microwave, millimeter wave or terahertz bands, that can be configured within a parallel plate structure, which solid state plasma monolithic microwave integrated circuit comprises: (i) a semiconductor dielectric substrate (3); (ii) parallel plates (1, 2) which comprise an upper conducting parallel plate (1) and a lower conducting parallel plate (2) and which parallel plates (1, 2) are used to guide an electromagnetic wave; (iii) an isolating trench which is between the parallel plates (1, 2), and which is used to contain a solid state plasma; (iv) a distinct p-doped region and a distinct n-doped region which are within a first semiconductor region defined by the isolating trench below the upper conducting parallel plate (1), and which are connected to two electrical bias terminals, where at least one electrical bias terminal forms a radio frequency short to the upper parallel plate (1); and a p or n doped region within a second semiconductor region defined by the isolating trench above the lower conducting parallel plate (2) and connected to a third electrical bias terminal, where the third electrical bias terminal forms a radio frequency short to the lower
(Continued)

conducting parallel plate (2), and wherein; a solid state plasma is able to be controlled by voltage biasing of the three electrical bias terminals to either reflect, absorb or transmit an electromagnetic wave.

20 Claims, 7 Drawing Sheets

(51) Int. Cl.
*H01L 27/08* (2006.01)
*H01P 1/15* (2006.01)
*H01L 21/56* (2006.01)

(52) U.S. Cl.
CPC ............ *H01L 2223/6683* (2013.01); *H01L 2224/16227* (2013.01); *H01L 2224/48227* (2013.01); *H01L 2924/1423* (2013.01)

(56) References Cited

U.S. PATENT DOCUMENTS

| | | | | |
|---|---|---|---|---|
| 5,821,827 | A * | 10/1998 | Mohwinkel | H03B 5/1852 |
| | | | | 331/99 |
| 10,135,146 | B2 * | 11/2018 | Henry | H01Q 13/08 |
| 2007/0109078 | A1 | 5/2007 | Kintis et al. | |
| 2014/0113828 | A1 * | 4/2014 | Gilbert | H01L 39/126 |
| | | | | 505/100 |

* cited by examiner

Diagram A

Diagram B

THREE TERMINAL SOLID STATE PLASMA MONOLITHIC MICROWAVE INTEGRATED CIRCUIT

This invention relates to a solid state plasma monolithic microwave integrated circuit, and more especially this invention relates to a three terminal solid state plasma monolithic microwave integrated circuit.

DESCRIPTION OF PRIOR ART

A method of using a semiconductor substrate to form an electronically steerable antenna employing a reconfigurable solid state plasma reflector has been disclosed in WO 2003056660 A1. Furthermore, U.S. Pat. No. 7,109,124 discloses a partial method for the manufacture of a solid state plasma antenna using a two terminal solid state plasma element employing a PiN diode structure.

A trench and refill is described in U.S. Pat. No. 5,561,073 A WO 2001071819 A2 discloses terminal surface PiN diode devices to generate a solid state plasma. WO 2003056660 A1 discloses two terminal through thickness PIN diode devices and a solid state plasma antenna.

U.S. Pat. Nos. 7,271,683 and 8,284,102 disclose a range of applications of solid state plasma devices. The circuit of the present invention may be for such applications.

A number of high resistivity silicon passivation approaches to reduce surface charge have been discussed in the following open literature but not specifically in the context of reducing the losses associated with silicon dielectric parallel plate waveguides:

Posada G, Carchon G, Soussan P, Poesen G, Nauwelaers B, De Raedt W. AR IMPLANTATION, A PASSIVATION TECHNIQUE FOR HIGH—RESISTIVITY SILICON WITHIN THE MCM-D TECHNOLOGY, Proceedings of the $1^{st}$ European Microwave Integrated Circuits Conference 2-9600551-8-7, September 2006.

Lederer D and Raskin J-P, NEW SUBSTRATE PASSIVATION METHOD DEDICATED TO HR SOI WAFER FABRICATION WITH INCREASED SUBSTRATE RESISTIVITY, IEEE Electron Device Letters, VOL. 26, No. 11, November 2005

BRIEF DESCRIPTION OF INVENTION

This invention relates to multiple solid state plasma generating elements, each element with at least three terminals. The plasma generating elements are connected together to form a monolithic microwave integrated circuit (MMIC) device, able to generate in an efficient manner a controllable solid state electron-hole plasma through the selection and electrical biasing of the terminals of the plasma generating elements.

When implemented within parallel plate electromagnetic (EM) wave-guiding structures, surface and through thickness devices have exhibited poor electromagnetic efficiencies in terms of relatively low reflectivity and high insertion losses (e.g. ~30% reflectivity, ~5 dB insertion loss for a 1 wavelength in air sized device). These losses come about due to the radio frequency (RF) shorts between the parallel plates being sub-optimal and surface charge associate with semiconductor-oxide interfaces, close to the parallel plate surfaces and around the isolating trenches, absorbing RF energy. The former detracts from the performance of the device when plasma generating device is active, that is, its reflective mode. The latter detracts from the performance of the device when the plasma generating device is inactive, that is, its transparent mode. The latter also affects the performance efficiency of the plasma generating device when it is active.

Intermediate biasing values generate a less dense electron-hole plasma that absorbs RF energy in a controlled way, that is, its absorptive mode. By applying a reverse bias, when previously in its reflective or absorptive modes, the electron-hole plasma can be more quickly extinguished and change to its transparent mode. With certain surface passivation treatments slight reverse biasing may also improve the transparency of the elemental plasma generating device.

It is the aim of the present invention to extend the MMIC manufacturing method to produce a near optimal plasma device of superior performance, (e.g. ~75% reflectivity, ~2 dB insertion loss for a 1 wavelength in air sized device), compared to the prior art through the embodiment of plasma elemental devices of three terminals or more, which ensure a high density, highly reconfigurable reflecting plasma capable of acting as an effective RF short between a parallel plate structure while remaining transparent (i.e. of very low reflectivity and absorbance) when the plasma generating three terminal device is inactive or two of the terminals are reverse biased.

Accordingly, in one non-limiting embodiment of the present invention there is provided a solid state plasma monolithic microwave integrated circuit having single or multiple elemental devices with at least three terminals operating within the microwave, millimeter wave or terahertz bands, that can be configured within a parallel plate structure, which solid state plasma monolithic microwave integrated circuit comprises:

(i) a semiconductor dielectric substrate;
(ii) parallel plates which comprise an upper conducting parallel plate and a lower conducting parallel plate, and which parallel plates are used to guide an electromagnetic wave;
(iii) an isolating trench which is between the parallel plates, and which is used to contain a solid state plasma;
(iv) a distinct p-doped region and a distinct n-doped region which are within a first semiconductor region defined by the isolating trench below the upper conducting parallel plate, and which are connected to two electrical bias terminals, where at least one electrical bias terminal forms a radio frequency short to the upper parallel plate; and
(v) a p or n doped region within a second semiconductor region defined by the isolating trench above the lower conducting parallel plate and connected to a third electrical bias terminal, where the third electrical bias terminal forms a radio frequency short to the lower conducting parallel plate, and wherein;
(vi) a solid state plasma is able to be controlled by voltage biasing of the three electrical bias terminals to either reflect, absorb or transmit an electromagnetic wave.

The solid state plasma monolithic microwave integrated circuit may be one in which the solid state material is high resistivity silicon.

The elemental devices may be annular in form. The diameter of the annular elemental device will typically be very much less than a half wavelength.

The elemental devices may be arranged individually so as to follow a set of geometric curves approximating to a continuous reflecting surface. The spacing between the elemental devices will typically be very much less than a half wavelength.

The solid state plasma monolithic microwave integrated circuit may be configured to follow a sequence of temperature compatible silicon processing stages applied to a high resistivity silicon wafer which progressively creates the radio frequency monolithic microwave integrated circuit. The silicon processing may be divided into five successive processing stages of:
(a) preparation of a silicon wafer to facilitate future processing and efficient parallel plate operation;
(b) fabrication of isolated plasma devices on silicon wafers;
(c) fabrication of multi-layer metal to allow an interconnect between the plasma generating devices and to create the radio frequency device ports;
(d) etching of the silicon wafer and subsequent backside metallisation to form a parallel plate radio frequency structure; and
(e) precision cutting of the silicon wafer to produce isolated plasma beam-forming devices.

To maintain integrity and prevent fragmentation during the silicon fabrication process, a silicon-on-insulator wafer may be used. The silicon-on-insulator wafer may be configured as a high resistivity device wafer and a handle wafer which have been anodically bonded with a separating layer of silicon dioxide that is able to be used as a chemical or reactive ion etch stop.

The upper and lower surfaces of the device wafer may be selectively amorphised to create a pattern of treated regions suitable for the subsequent fabrication of annular elemental plasma devices, so as to reduce the degree of accumulation of surface charge and thereby reduce the ohmic losses associated with parallel plate, silicon dielectric waveguide operation surrounding the elemental plasma devices. The upper and lower surfaces of the device wafer may be selectively amorphised by ion bombardment, or by selective deposition of amorphous or polysilicon.

A buried layer under the silicon dioxide layer in the device wafer may be selectively doped in circular regions to facilitate future fabrication of ohmic contacts associated with the elemental devices.

A dry etch process may be used to create an annular trench around elemental devices under fabrication, followed by the deposition of a high resistivity oxide layer on the walls of the trench to minimise the electron-hole surface recombination rate when a solid state plasma is generated, succeeding by the filling of the trench with amorphous silicon or polysilicon to re-establish mechanical integrity of the device wafer.

Surface PiN diodes may be formed from an outer implanted region surrounding an inner implanted region, concentric with and inside cylindrical walls of the isolating trench.

The solid state plasma monolithic microwave integrated circuit may be one in which a first layer of metal is deposited to the device wafer to form the top parallel plate. The first layer of metal may be selectively etched, then covered with an insulating layer which is also selectively etched, to allow a second interconnecting layer of metal to be applied that connects the solid state plasma elements in adjacent groups. The second layer may be selectively etched and a further insulating material may be applied and selectively etched together with an optional third layer of metal which is selectively etched such that the third interconnecting layer of metal connects the groups of connected adjacent elements to bonding pads.

The interconnection may be either in parallel or in series or a combination of both series and parallel. The handle wafer may be removed leaving the insulated silicon dioxide layer of the device wafer which is further etched to expose the doped regions within the elemental devices to allow metalisation which forms the lower parallel plate and ohmic contact to the plasma elemental devices. The handle wafer may be amorphised to reduce surface charge and may be selectively removed to expose the doped regions within the elemental devices to allow metalisation which forms the lower parallel plate with raised ohmic contact to the plasma elemental devices.

The wafer may be laser cut, cleaved or core drilled to produce individual dice. An electronic control device in the form of a naked die may be directly integrated to a radio frequency monolithic microwave integrated circuit die. The control device may be connected to the pads of the radio frequency monolithic microwave integrated circuit using flip chip and solder bump technologies.

The control device may simultaneously bias connected groups of elemental plasma devices to form regions of reflectivity, transparency and absorbency within the parallel plate monolithic microwave integrated circuit. A radio frequency printed circuit board may be interfaced to the parallel plate monolithic microwave integrated circuit to provide radio frequency ports. The plasma radio frequency monolithic microwave integrated circuit, the control chip and the radio frequency printed circuit board may be encapsulated within a single surface mount package.

The solid state plasma monolithic microwave integrated circuit may be used in radio frequency commutators, high linearity switches, fast beamformers, electronically controllable time delays, tuneable filters and smart antennas.

The bias and selection circuitry associated with the solid state plasma MMIC can be implemented using available electronic devices (e.g. Field Programmable Logic Arrays FPLAs, PiN diode drivers) and may be either integrated on the MMIC itself, for example using flip-chip technology, or via control lines to the MMIC connected via wire-bonds or solder-bump technology to a PCB.

The RF ports, allowing an EM signal to transit into and out of the parallel plate waveguide, may be achieved using RF transitions between microwave tracks, waveguides or coaxial cables which transform the impedance of the port (e.g. to 50Ω) to that of the parallel plate, (e.g. typically a few Ω). These impedance transitions are well-understood by microwave engineers and in printed form may be advantageously positioned on a separate RF PCB and are usually based upon intermediate microwave tracks or waveguides of effective electrical length $\lambda_e/4$, that function in the same way as a matching or a blooming layer in an optical components to minimise backward reflections and the insertion loss of the transition over an operational band. In the case where the MMIC device launches directly into air the effective dielectric constant of the transition material is for single stage of matching the square root of the permittivity of matching material. The RF ports with their transitions may be arranged around the outer perimeter of the MMICs parallel plate structure or in the body the device (e.g. at the focus of the plasma reflector, normally the geometric centre of the device). The intensity and phase of the output ports depend directly on the shape and characteristics of the selected plasma elements, adjusted by voltage biasing, in their associated modes (i.e. reflective, absorptive, transparent).

The solid state plasma MMIC device is based on the optical path lengths travelled by an EM wave, normally conceptualised as a group of rays, travelling between parallel plate silicon waveguide. It is therefore inherently wideband, its bandwidth being limited by the transitions associated with its RF ports and interference effects associated with direct (i.e. no reflection off the plasma reflector) and indirect paths (e.g. reflections off the plasma reflector) between the RF ports resulting in constructive or destructive effects, which can be optimised for a given application to provide optimal bandwidth and spatial selectivity. Due to silicon having a high refractive index the MMIC may be highly compact, typically about a third of the size of an equivalent air-dielectric configuration. Intrinsic silicon is a good dielectric and therefore the MMIC device is able to handle high RF powers without dielectric breakdown, typically >10 W for 100 micron thick parallel plate. As a result of only small volumes of electron-hole plasma being generated the diffusion distances are small and the time taken to create a reflective plasma short, typical less around one microsecond for a 100 micron element.

The solid state plasma MMIC has numerous applications in fields, such as: many-way RF commutators, high linearity switches, fast beamformers, electronically controllable time delays, tuneable filters and smart antennas.

BRIEF DESCRIPTION OF DRAWINGS

Embodiments of the invention will now be described solely by way of example and reference to the accompanying drawings.

DESCRIPTION OF PREFERRED EMBODIMENTS

Referring to the diagrams, the various orientations of the invention that are shown are entirely arbitrary and the invention's operation is totally independent of its orientation. The following use of qualifying adjectives such as: upper and lower, above and below, vertical and horizontal relate to the chosen orientation within the particular Figure and are intended purely to facilitate the following descriptive process.

Figure 1:
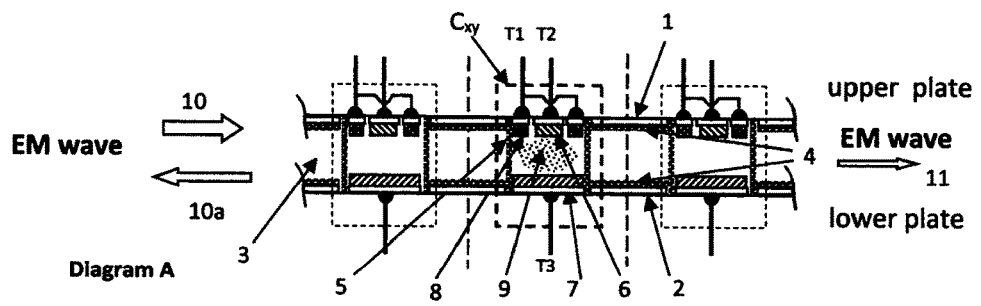
FIG. 1 shows overview diagrams of solid state plasma MMIC device in cross-section, (Diagram A), top view (Diagram B) and bottom view (Diagram C)
Figure 1:
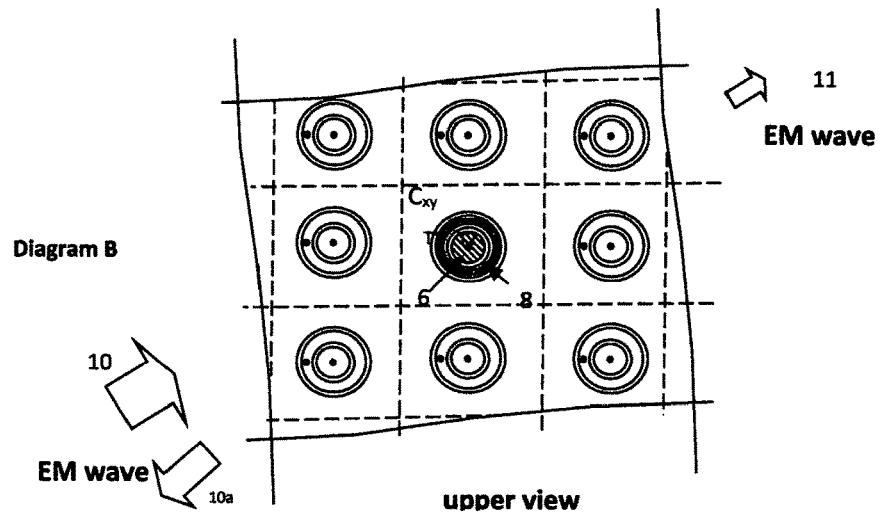
Figure 1:
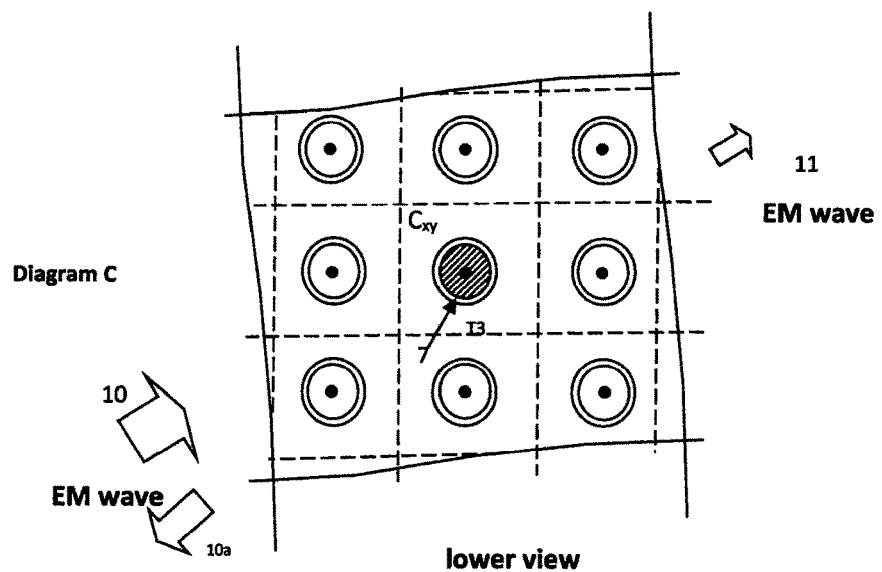

A pictorial overview of the MMIC device used to generate a reconfigurable solid state plasma reflector is illustrated in cross-section by way of FIG. 1, Diagram A. The configuration comprises two parallel plates which form a waveguide, for ease of reference labelled upper plate 1 and lower plate 2, but essentially independent of device orientation. These parallel plates are applied directly to a high resistivity semi-conductor substrate 3, such as N-type float zone silicon. The atomic interface 4 between the upper-plate 1 and semiconductor substrate 3 is passivated in such a way to minimise surface charge effects and so minimise the associated RF ohmic losses as a wave travels through the parallel plate waveguide. Positioned directly between the parallel plates are the containing walls 5 of the plasma generating elemental devices, in this example, the walls are cylindrical. Within the inner region, contained by the walls 5, of each elemental device, a surface PIN diode structure is created, the N-doped inner region 6 and the P-doped outer region 7 are heavily doped so that when strongly forward biased the terminals T1 and T2, (i.e. a voltage greater than the band gap applied), they create a high density electron-hole plasma 9.

The walls 5, which are created using a trench and refill process, are highly insulating and are used to localise the electron-hole plasma 9 and prevent it from diffusing throughout the semi-conductor dielectric 3. As with the parallel plates 1 and 2, the confining walls 5 are passivated in such a way to minimise surface charge effects and so minimise the associated RF ohmic losses. In order to improve the distribution of the plasma and create a strong RF short between the upper 1 and the lower plates 2, a third terminal T3 is created which has a N-doped region 8 to ensure a good ohmic contact. An EM wave 10, enters the parallel plate waveguide, for example by an RF transition, such as flared or printed horn, microwave track or driving monopole between the parallel plates, (not shown, but illustrated in other patents, e.g. [1]). The EM wave passes through the inactive devices illustrated as lightly dashed cells (i.e. the inactive elements in transparent mode), but is also partially reflected back 10a and strongly attenuated in the forward direction 11 by the heavily dashed cell (i.e. the active element in reflective mode).

The MMIC is shown from upper and lower perspectives in FIG. 1, Diagrams B and C. It will be appreciated that by selecting and appropriately biasing the cellular elements within the parallel plates, 1 and 2, can be used to guide and modulate the EM wave. Adjacent elemental cells are typically $<A_d/2$ in dielectric apart, when lines of adjacent elements are strongly conducting they form a highly reflective grid (i.e. a discretised reconfigurable plasma reflector) which acts as a localised RF short between the plates through which the EM wave cannot pass (i.e. highly attenuated) and can be reflected in a controlled way, behaving essentially as a continuous reflecting conductor.

The key components of the present invention as shown FIG. 1 are a microwave monolithic integrated circuit, (MMIC), in the form of the upper parallel plate 1 and the lower parallel plate 2, constructed on the semiconductor substrate 3, which, in a preferred embodiment, is high resistivity silicon.

The formation of the atomic interface 4 between the outer parallel plates and inner silicon is important as it attracts the accumulation of surface charge which increases the conductivity of the silicon dielectric close to the interface that in turn increases the RF ohmic loss of the silicon dielectric parallel plate waveguide. By passivating (e.g. amorphising the silicon close to the metal-silicon by ion bombardment,) the silicon-metal interface 4 the surface charge may be minimised and resultant ohmic losses reduced, so permitting an EM wave to travel through the waveguide with significantly lower loss.

The MMIC is divided into elemental cells capable of generating localised electron-hole plasma, where a typical cell $C^{xy}$, is defined by its positional x, y coordinates in the horizontal plane of the semi-conductor substrate.

The central x,y coordinates of a plasma cell, may take the form of regular equally spaced array or more efficiently follow a spatially sampled curve or set of curves, for example, an elliptical curve with parametric equation:

$$x = a \cdot \sin(\theta), y = b \cdot \cos(\theta), \text{ where } \theta_1 < \theta < \theta_2$$

where the Euclidean distance between adjacent spatial samples is usually much less than $\lambda_d/2$ and $\theta$ is a parameter defined over the interval $\theta_1$ to $\theta_2$. Such parametric equations, usually conic sections, are typically translated and rotated about a common point or origin, normally their focal points, to produce a family of curves that represent equations of reflecting surface that may be individually or collectively selected by a process (e.g. a control device) to be described below.

The typical cell $C_{xy}$ is shown in more detail and highlights the form of the electron-hole plasma generating element surrounded by an isolating trench 5, filled with polysilicon. The preferred device geometry is annular, however other geometries with a variety of alternative cross-sections, (e.g. square, rectangular) are possible. Three terminals T1, T2 and T3 are shown for the typical cell $C_{xy}$ connected to the selectively N-doped and P-doped regions 6, 7 and 8. The doping regime may reversed for P-doped silicon however what were accumulated regions become inverted regions and the implementation is less straight forward with no apparent benefits.

These terminals are ohmic and interface to positively P and negatively N doped regions within the semiconductor substrate contained within confines of the isolating trench. The upper two terminals T1 and T2 connect to doped regions 6 and 7 and may be seen to form a surface PiN diode, where the chosen semi-conductor substrate material form a high volume intrinsic i region which is a good, low loss insulator when no bias is applied to the terminals due to it having very few free carriers.

When a forward bias is applied through terminals T1 and T2 then the P and N doped regions flood the entire intrinsic i-region with free carriers (i.e. electrons and holes) to form a dense electron-hole plasma 9. Through the use of silicon with a long carrier life time (e.g. a few milliseconds) and surface treatments to achieve low surface re-combination rates, a high density electron-hole plasma may be sustained for relatively low driving powers (e.g. a few mW for a 100 micron diameter, 100 micron high annular device).

A strong RF short between the upper plate 1 and the lower plate 2 is through the introduction of a third terminal T3 which has a N-doped region 8 to ensure a good ohmic contact. An EM wave 10, enters (or leaves) the parallel plate waveguide, for example by an RF transition, such as flared or printed horn, microwave track or driving monopole between the parallel plates, (not shown, but illustrated in other patents, e.g. U.S. Pat. No. 6,825,814). The EM wave passes through the inactive devices illustrated as lightly dashed cells (i.e. the inactive elements in transparent mode), but is also partially reflected back 10a and strongly attenuated in the forward direction 11 by the heavily dashed cell (i.e. the active element in reflective mode).

As a preferred embodiment the solid state plasma device is implemented as a thin microwave monolithic integrated circuit (MMIC) that may be fabricated, for example, by the successive use of optical mask lithography, generally following either a step and repeat or contact or contact-proximity process, which spatially define such standard manufacturing processes as: deep reactive ion etches (DRIE) and areas of ion implantation and metal deposition patterns. It is recognised that the successive silicon processing stages must be compatible and subsequent stage fabrication processes must not disrupt or reverse an earlier stage process, for example, an annealing process must not cause re-crystallisation of an amorphous region, unless this re-crystallisation is acceptable in terms of the MMIC's ohmic losses. This restriction constrains significantly the processing stages and allows limited variation in the fabrication sequence and the associated temperature excursions used. A further requirement is that the resulting MMIC must be mechanically robust and not de-fabricate under vibration and operating temperature excursions.

Solely by way of example, the silicon fabrication of the MMIC will now be explained in terms of a lithographic mask processing sequence suitable for high volume mass production applied to a silicon-on-insulator (SOI) wafer which helps avoid fragmentation during the silicon processing stages.

Figure 2:
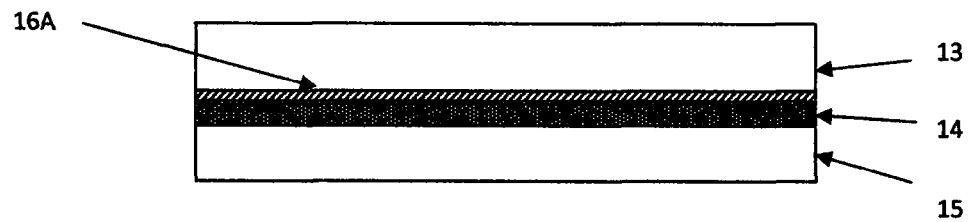
FIG. 2 shows silicon on Insulator wafer with blanket doped implants.

FIG. 2 illustrates a SOI wafer commonly used by the silicon processing industry, which is configured as a device wafer 13 anodically bonded to a handle wafer 15. To produce solid state plasma MMICs device the silicon device wafer 13 is made from high purity float zone silicon which has a long carrier lifetime, (e.g. greater than 1 millisecond) and high resistivity (4000+$\Omega$). The handle wafer 15 can employ lower specification silicon, (e.g. 500$\Omega$), if not used as part of the wave guiding structure. It is used to provide increased rigidity to the device wafer during processing. The handle wafer is later totally or partially removed by chemical etching or other standard technique (e.g. hydrogen implant exfoliation). Typically a silicon dioxide 14 layer exists between the device wafer 13 and the handle wafer 15. This layer of silicon dioxide can act as an etch-stop if chemical etching is used to remove the handle wafer. The device wafer may have a blanket doped implant 16A prior to the anodic bonding to allow a subsequent stage ohmic contact to be made.

Figure 3:
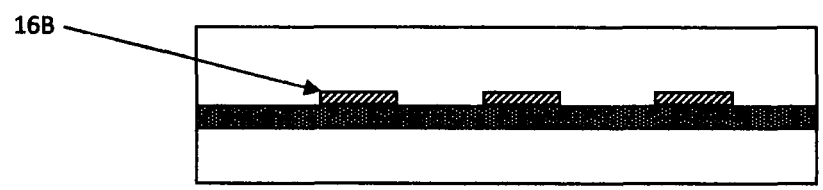
FIG. 3 shows silicon on Insulator wafer with localised doped implants.

FIG. 3 shows how the SOI wafer may be advantageously doped with localised implants 16B which are positioned to correspond to the positioning of the electron-hole plasma elements, to be fabricated during subsequent processing steps, and to which the third terminals are attached. The space between the localised implants 16B may be amorphised, for example, by the bombardment of ions to reduce the accumulation of surface charge or previously applied by a deposition process. In this way the ohmic losses in the completed parallel plate MMIC device are reduced. This surface treatment may be left to later in the silicon processing sequence to allow higher processing temperatures (e.g. ohmic contact activation) to be used in the early processing stages which might for example cause the amorphised silicon to re-crystallise which may cause some unwanted re-accumulation of surface charge.

Figure 4:
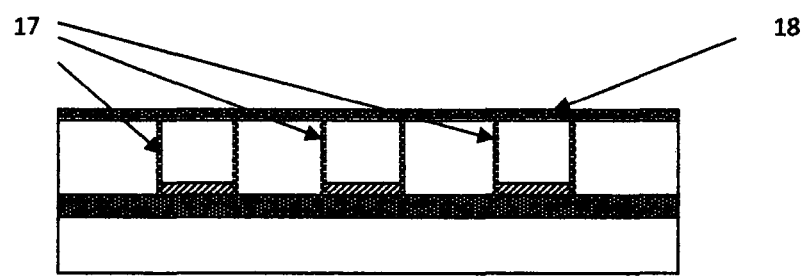
FIG. 4 shows wafer after trench and refill.

In FIG. 4 the SOI wafer has had a trench and refill process carried out in order to prevent the electron-hole plasma from diffusing throughout the device wafer. In this way the electron-hole plasma is confined to a relatively small elemental volume, (e.g. typically ~100×100×100 μm), within the silicon substrate defined by the inner walls of trench 17 and between parallel plates, yet to be formed. Before filling the trench the walls are passivated with an oxide, nitride or mixed layer to act as a barrier to the diffusing electrons and holes and minimise the electron and hole recombination rates when active (i.e. reflecting), as well as minimising the surface charge accumulation when inactive (i.e. transparent). This minimises the DC power consumed by the elemental devices, which is typically a few tens of mW for a 100 μm elemental device. The trench refill material is typically poly-crystalline or possibly amorphous silicon and is usually achieved by a deposition process. In order to minimise the accumulation of surface charge on the upper planar surface a layer of amorphous or polycrystalline silicon may be introduced, covered by a relatively thick layer of deposited silicon dioxide 18 to produce a planar surface. Alternatively, the deposition of the amorphising layer may be omitted and the amorphising process below the silicon dioxide achieved at a later stage by ion bombardment.

Figure 5:
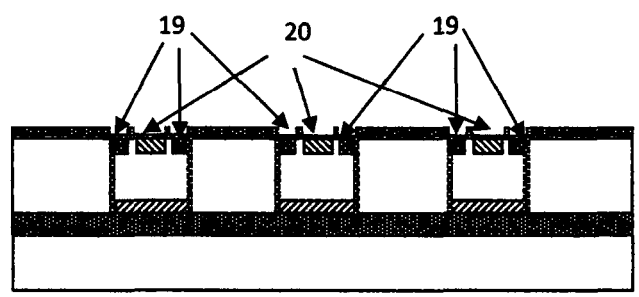
FIG. 5 shows wafer after formation of P and N doped regions.

The implantation of the P and N doped regions within the confines of the trench is illustrated in FIG. 5. A high temperature activation is required to allow a good RF short between the outer and lower terminals of the upper and lower parallel plates respectively, with the reactance of the PiN's annular geometry primarily limiting the RF performance of the device. Here, the P type region 19 is formed as an annular region which surrounds the centre N type region 20. In preparation for the first layer of metallisation shallow trenches are formed immediately above the implanted P and N regions.

Figure 6:
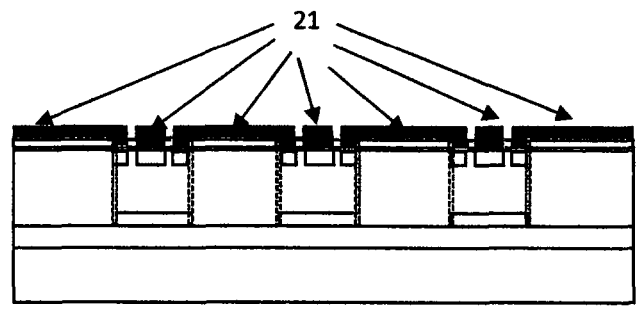
FIG. 6 shows wafer after deposition and patterning of $1^{st}$ metal layer.

As shown in FIG. 6, the first layer metal 21 has been deposited and patterned to form one plate of the parallel plate waveguide and interconnect all the outer annular N-type terminals of the plasma elements together as a common voltage rail.

Figure 7:
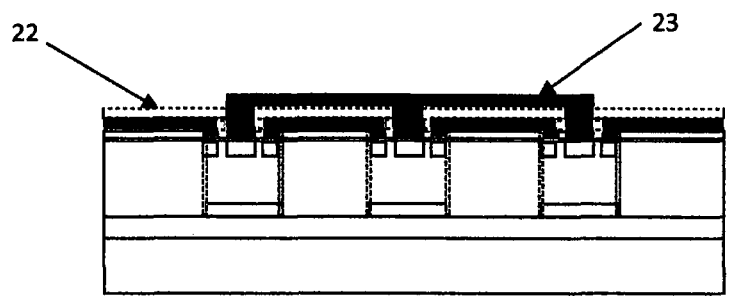
FIG. 7 shows wafer after deposition and patterning of 2nd metal layer.

In FIG. 7, a planarising layer 22 of silicon dioxide or other insulating material has been applied, with material from the centre P-type regions selectively removed to allow contact to the second layer of metallisation 23 which has been blanket deposited and selectively removed. This second layer of metal connects localised groups of adjacent elements together which then connect to control pads that in turn can be connected to external control bias circuitry, to be discussed below. Each sub-group of elements forms part of an electron-hole plasma reflector. Sometimes the sub-groups are shared between differently orientated overlapping plasma reflectors.

Figure 8:
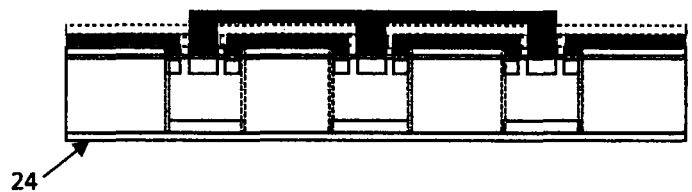
FIG. 8 shows removal of handle wafer.

The removal of the handle wafer is shown in FIG. 8. If achieved by a chemical etching process the removal of the handle wafer results in a thin layer of silicon dioxide 24 remaining. This silicon dioxide needs to be selectively removed to allow good connection to the lower terminals of each elemental device, for example, by the use of a reactive ion etch. The process requires good front-to-back alignment of the wafer.

Figure 9:
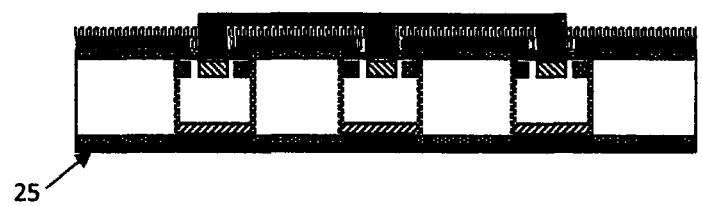
FIG. 9 shows deposition of backside metal.

FIG. 9 illustrates the deposition of the layer of backside metal 25 which serves as the second parallel plate that also acts a common third terminal to all the elemental devices.

A typical silicon fabrication process for a solid state plasma MMIC device, in line with the above description and diagrams may be summarised as follows:

(a) Select a semiconductor wafer of suitable carrier type, resistivity and minority carrier lifetime; this may be either a bulk wafer, or a silicon-on-insulator wafer comprising device and handle layers separated by a suitable dielectric such as silicon dioxide, known as the buried oxide layer (BOX). In the latter case, the device wafer is implanted with an n-type dopant on the rear side and/or a high resistivity polysilicon or amorphous silicon layer deposited prior to the formation of the SOI structure. This implant may cover selected regions corresponding to where the plasma generating elements are to be placed. The thickness of the device wafer may typically be between 50 and 200 μm;

(b) Introduce localised regions in which the plasma is generated by means of a trench and refill process which comprises: 1) dry etch to produce trenches through the thickness of may be introduced into the refill process; 2) thermal oxidation or deposition of a suitable dielectric such as silicon dioxide or silicon nitride to form a trench line; 3) deposition of a high resistivity polycrystalline or amorphous silicon layer of sufficient thickness to completely fill the trench; and 4) polish back the front surface of the silicon wafer until the original surface is revealed. The isolated regions will contain the plasma diodes and are typically 10 to 500 μm in diameter;

(c) Optionally, deposit a layer of high resistivity polysilicon or amorphous silicon over the front of the wafer;

(d) Subject the wafer to high temperature oxidation to produce a thick layer of silicon dioxide, typically 1 μm;

(e) Subject the wafer to stabilisation on a gas mixture containing a small percentage of oxygen at a temperature above 900 C to improve the quality of the silicon/silicon dioxide interface;

(f) Optionally, perform a high energy (MeV) implant of a species such as silicon, neon or argon to introduce damage sites into the silicon immediately below the silicon/silicon dioxide interface;

(g) Selectively remove the silicon dioxide and thermally oxidise to produce a thin (typically 100 nm) layer of silicon dioxide;

(h) Define the regions which form the P part of the PiN diode and implant with a high dose of a p-type dopant, e.g. boron;

(i) Define the regions which form the N part of the PiN diode and implant with a high dose of an n-type dopant, e.g. phosphorus;

(j) Perform a high temperature (~950° C.) activation, (typically 1 hr in N2);

(k) Selectively remove the silicon dioxide from above the P and N regions;

(l) Deposit a thick (typically >1 μm) layer of a conductive material such as aluminium;

(m) Selectively remove this metal to make contact to the P and N regions, which form two of the three terminals of the plasma device. The thick metal layer also forms one wall of the waveguide in the areas away from the PiN diodes;

(n) Optionally, perform a low temperature bake at between 300 and 500 C to reduce interface state density;

(o) Deposit a layer of electrically insulating material such as silicon dioxide, silicon nitride or silicon oxynitride;

(p) Selectively remove this material to open contact hole down to the underlying metal;

(q) Deposit a thick (typically >1 μm) layer of a conductive material such as aluminium;

(r) Selectively remove this metal in such a way as to connect the plasma diodes together in the required shape, e.g. a line, parabola, hyperbola or ellipse;

(s) Repeat steps (n) to (q) to take control lines out to appropriately located pads on the plasma device;
(t) Remove the handle layer from the back of the wafer: either the whole wafer may be removed, or selective areas under the plasma device;
(u) Optionally, perform a high energy (MeV) implant of a species such as silicon, neon or argon to introduce damage sites into the silicon immediately below the BOX layer;
(v) Selectively remove the BOX layer;
(w) Deposit a thick (typically >1 µm) layer of a conductive material such as aluminium: this acts as the contact to the third terminal of the 3 terminal elemental plasma devices, and also forms the second plate of the waveguide;
(x) Cut out each plasma device using a laser, diamond saw or wet or plasma etch technique.

In terms of the design and fabrication of the solid state plasma MMIC device, a number of further clarifications concerning alternative implementations may be required together with ways in which the MMIC device may be packaged and interfaced with the surrounding RF and control circuits.

Figure 10:
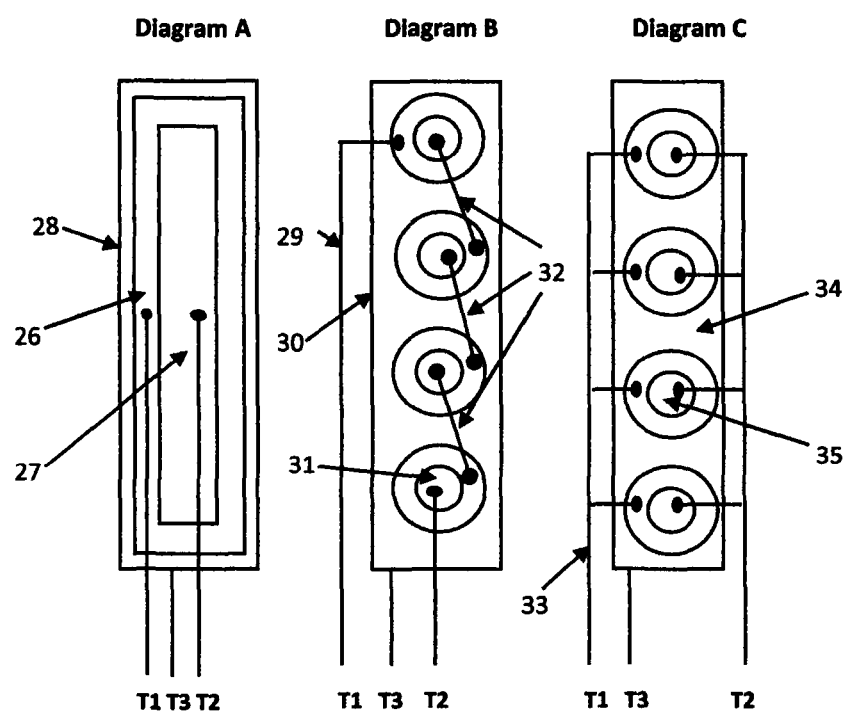
FIG. 10 shows rectangular plasma device (Diagram A), serially connected plasma device (Diagram B), parallel connected plasma device (Diagram C)

A first point of clarification concerns how the electron-hole plasma generating cells may be configured, interconnected in groups and positioned to follow a reflector shape. FIG. 10 illustrates three possible strategies:
(1) Single narrow cell Diagram A
(2) Group of annular cells connected series Diagram B
(3) Group of annular cells connected in parallel Diagram C All variations are possible and may be chosen according to the required functionality. Concentric layers of cells may also be used to increase the reflectivity of the active plasma reflector.

The single narrow cell shown in Diagram A of FIG. 10 has the advantage that it is intrinsically simple, however it is also less robust and may be prone to device fracture or fragmentation. The cell comprises three terminals: T1 connected to the outer region 26 of the plasma device, T2 connected to the inner region 27 of the plasma device and T3 connected to base region 28 of the plasma device. Although shown as a rectangle in could be configured to follow the curvature of a reflector. The approach will tend to require more DC power to switch as quickly as a group of cells, moreover the large electrode size may start to increase the overall insertion loss in the off state (i.e. the transparent mode), especially if the major dimension increases to more than $\lambda_d/4$. However it is recognised that this type of cell geometry may be appropriate at higher frequencies where high plasma reflectivity may be harder to achieve and the greater continuity (i.e. fewer gaps in the reflector) is advantageous.

The group of annular cells shown in Diagram B of FIG. 10 connected in series to form a chain has the advantage of minimum track widths and associated current handling. The chain can readily be configured to follow a curve, however the metallisation for most realisations is likely to involve more metal vias and a single elemental device failure (e.g. no through connection when the device is active) results in the failure of the whole group. The group of series connected cells comprises three terminals: T1 connected to the outer region 29 of the first plasma device in the chain, T2 connected to the inner region 30 of the last plasma device in chain and T3 connected to base region 30 of the plasma device. Consecutive elemental devices have their inner and outer terminals linked together by metallised tracks 32. Also the driving voltage applied to needs to increase as the number of devices arranged in series, which leads to added complexity in the driver circuitry and practically limits the number of cells that may be connected in series to form a chain.

The group of annular cells shown in Diagram C of FIG. 10 connected in parallel appears the best overall choice as the parallel plate is almost continuous with vias only required through the first layer metal to the central region and allows excellent flexibility in terms of the cells conforming to a curved trajectory and produces a plate with minimum sized perforations, so minimizing unwanted effects, such as: transmissive loss through the perforations or absorptive loss in parallel plate due to associated surface roughness. The group of cells connected in parallel comprises three terminals: T1 connected in parallel to all the outer regions 33 of the first plasma devices in the group, T2 connected to the inner regions 34 of all the plasma devices in the group and T3 connected collectively to base regions 35 of the plasma device through a single metallisation layer. It is noted that the power carrying tracks needed to be adjusted in width according to their power carrying capacity and therefore may take more circuit area than the series approach. However the approach has the advantages that a single device failure (e.g. no through connection when the device is active) will not result in the failure of the group and the upper parallel plate suffer only the minimum of disruption to continuity in terms the central perforation hole above each elemental device.

Practically, groups of between 5 and 25 plasma elemental devices may be interconnected and driven collectively. These groups may be routed to pads that may in turn be connected to external control circuitry. This routing may require a third layer of metallisation depending on the positioning of the pads. Moreover with complex plasma reflector designs involving many intersecting selectable plasma reflectors a third layer of interconnecting metal often becomes necessary. This routing requirement is illustrated in FIG. 11, for the case where the pads are at the periphery of at 32 reflector MMIC to allow control wire bonds to be made to an external control PCB, (not shown) and two interconnecting layers (i.e. first and third layer metal 36 and 39 respectively) are used.

Figure 11:
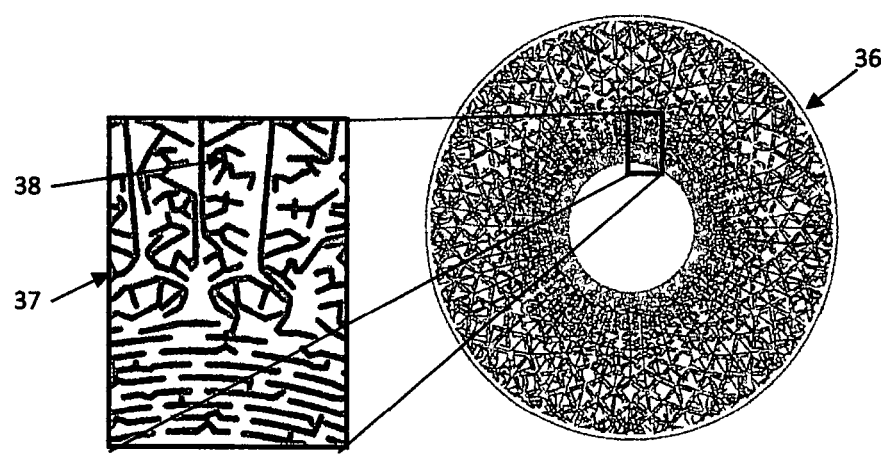
FIG. 11 shows metallisation layers two (Diagram A) and three (Diagram B) with local enlargements.
Figure 11:
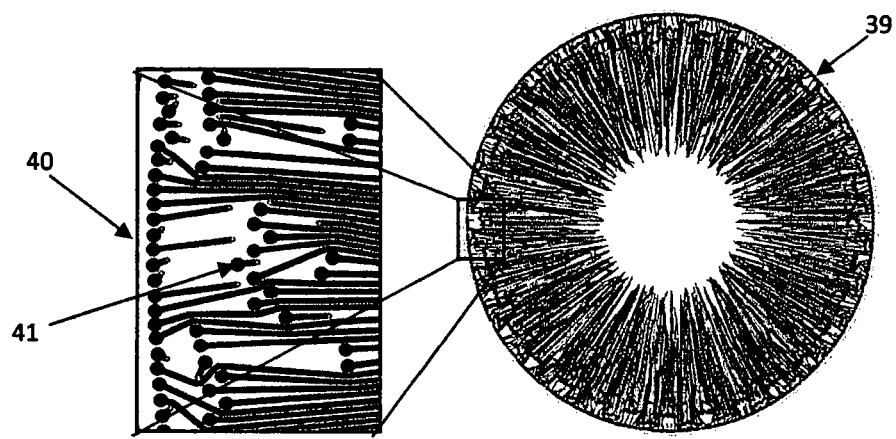

In Diagram A of FIG. 11 the second layer of metallisation 36 is shown for a 32 elliptical reflector MMIC device. Here the interconnection for a typical sub-group 38 can be seen for an enlarged regions 37. A single plasma reflector will be made up of many such sub-group of typically 20 or so elements and may use 10 to 20 such sub-groups.

In Diagram B of FIG. 11 the third layer of metallisation 39 composed mainly of radial tracks is shown for the same 32 elliptical reflector MMIC device. Here a typical radial track connecting to a peripheral pad 41 can be seen for an enlarged regions 40.

Figure 12:
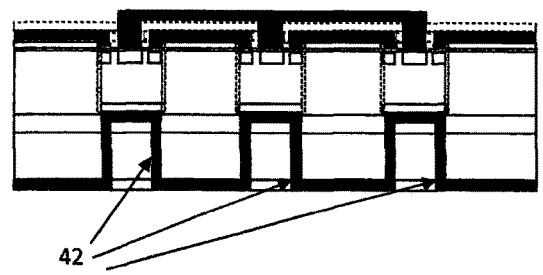
FIG. 12 shows alternative parallel plate MMIC with plasma generating devices on pedestal vias.

A second point of clarification is illustrated in FIG. 12, here an alternative configuration, based on the earlier configuration shown in FIG. 7 where the MMIC's handling wafer still in place and now configured with a plasma generating devices on metallised pedestal vias 42 formed through the thickness of the handling wafer. This alternative approach has the advantage of requiring less material to removed, allowing the device to remain more robust. However the approach may lead to greater insertion losses and poorer matches due to the lack of smoothness (i.e. discontinuities in the lower parallel plate) caused by metal pedestals causing operation over a reduced bandwidth. It should be recognised that these negative effects need to be balanced against the positive effects of a thicker more robust device, while also allowing the possibility smaller volumes of plasma to be generated requiring less DC power with faster switching times and/or greater inter-plate spacings.

Figure 13:
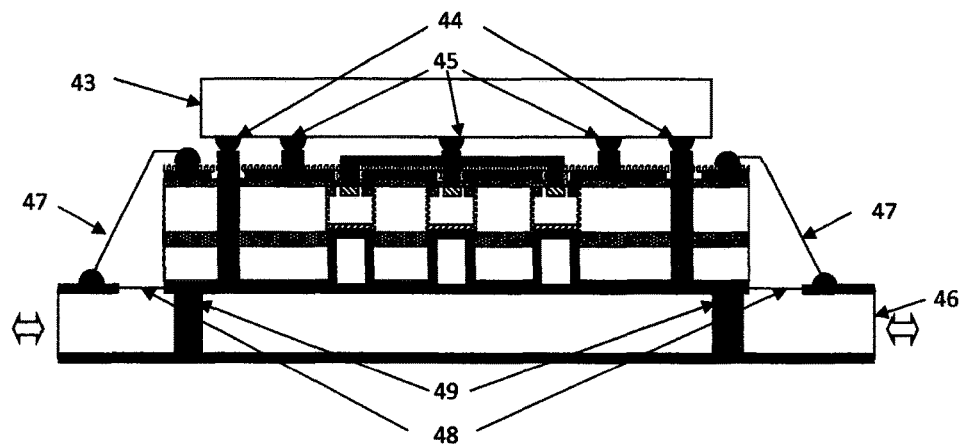
FIG. 13 shows solid state plasma MMIC configured using solder bump technology with a flip-chip control IC and RF wire-bonded base PCB.

FIG. 13 illustrates how the solid state plasma MMIC shown in FIG. 12 may be configured using solder bump technology, 44 and 45, with a flip-chip control chip 43 and RF wire-bonded PCB or thick film ceramic circuit 46. The flip chip control circuit 43 may take a wide variety of forms and perform a variety of functions, but is essentially a complex control network capable of selecting and driving single or groups of elemental plasma devices either pre-arranged to follow pre-defined plasma reflector shapes or alternatively allow for complete flexibility employing a regular set of elements arranged to conform to a regular Cartesian or polar grid, the former case tending to allow for the faster selection of a desired reflector shape and employing less circuitry than for the latter case with its greater reconfigurability. For the latter case and at the expense of more control circuitry, a reflector shape may be pre-loaded into an array control memory and then selected through a single high speed enable line. The time required to switch beams will be limited by the time it takes to transfer charge into an element, elements behind the currently selected reflector may pre-charged for very high speed beam switching. The control chip may also allow reverse biasing of the plasma elements and continuous control of their forward biasing to allow varying degrees of absorbance, reflectivity and transparency. By not only controlling the plasma reflecting elements, but also the elements behind the plasma reflectors greatly improved peripheral port isolation (e.g. >40 dB) and sidelobe levels can be achieved.

External element device selection of the control network contained in the flip chip may be facilitated either through dedicated through dedicated control lines to solder bumps or potentially advantageous via wireless or optical connection as this approach causes no blockage to the EM signal when passing through the parallel plate. However, it is noted that the need to supply DC power and suitable grounds to the control chip usually requires some interruption of the parallel plate. When the parallel plate transits into microwave tracks, (a common configuration), the vias between the tracks may be used to convey both control signals and DC power without affecting, (e.g. distorting or attenuating) the EM signal.

The launch of the EM wave may be achieved through a RF PCB board or RF ceramic thick film circuit 46. Here wire-bonds 47 are used to form an electrical connection between the upper parallel plate of the MMIC device and upper layer of RF circuit 46 which may be either continuous parallel plate or multiple microwave tracks that may each be in the form of tapered or stepped impedance transformers to obtain good RF match (i.e. a low reflection coefficient). It should be noted that a narrow insulating slot 48 exists around the MMIC and top layer of metal to prevent shorting of the RF signal and that metal vias 49 connect the lower parallel plate with the ground plane of the RF circuit. At the expense of occupying valuable silicon area the transitions could alternatively be on the MMIC. The precise geometry of RF transitions, together with the choice of dielectric materials is critical and highly frequency dependent. The design of the transition is usually established through detailed EM modelling.

Figure 14:
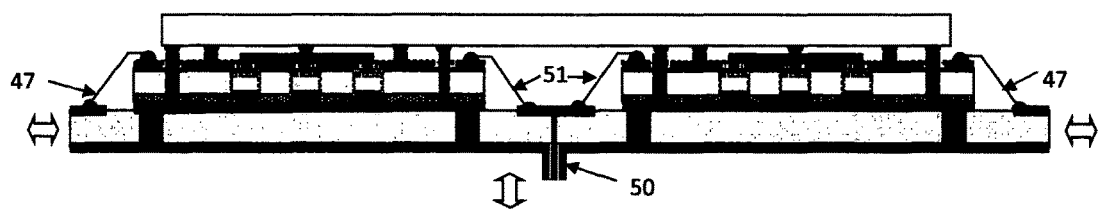
FIG. 14 is a schematic illustrating inner and outer RF terminals implemented using wire bonds to an RF PCB board or thick film ceramic.

FIG. 14 illustrates one implementation used to launch an omni-direction EM wave. This configuration uses a centralised circular hole in the silicon substrate which allows wire bonds 50 between the parallel plate to a RF PCB board or ceramic thick film circuit contain a bonding pad in turn connected to the inner terminal of an RF connector 51 or further layer of RF circuit routing (not shown).

Figure 15:
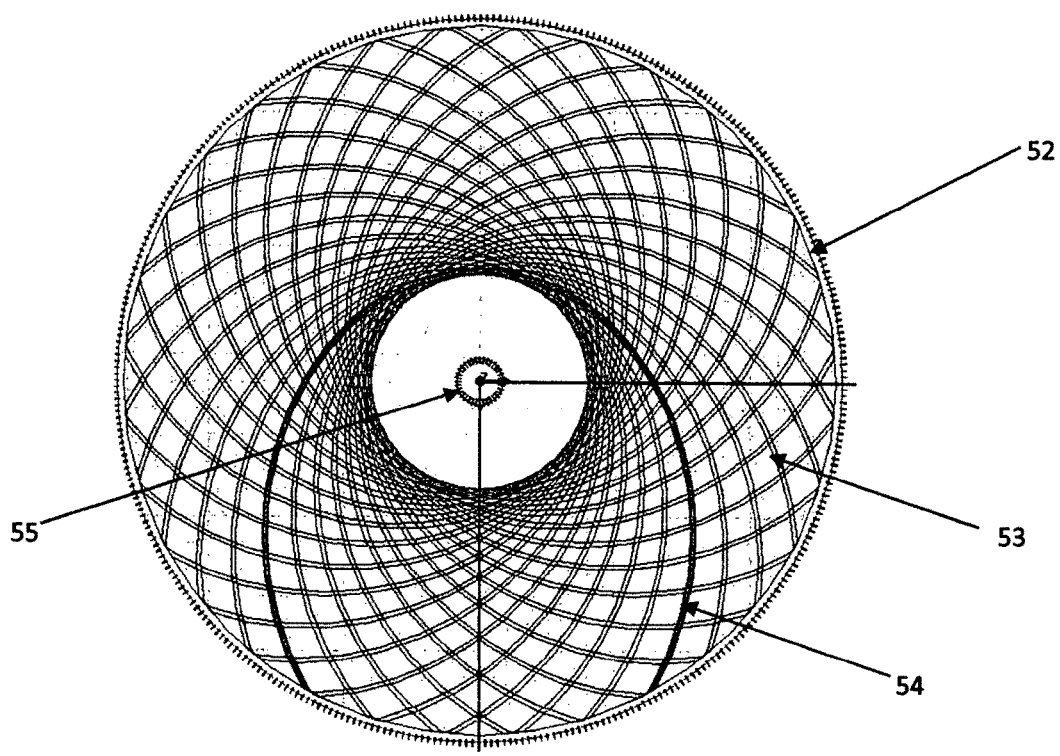
FIG. 15 is a schematic of one possible plasma device configuration in the form of a 32 way commutator switch.

One possible plasma device configuration in the form a 32 way commutator switch is illustrated in FIG. 15. The design progresses from the earlier stages of silicon processing and metallisation shown previously in FIG. 11. The schematic shows in plan form a thin cylindrical parallel plate design 52 with 32 closed elliptical reflectors 53, one of which is highlighted 55. The centralised feed 54 using the wire-bonding approach already discussed and shown in cross-section as FIG. 14. The RF wire-bonds 55 around the circumference of the device is also shown.

It is noted that the solid state plasma MMIC broadly scales with frequency. To allow the support of a transverse electro-magnetic wave TEM wave between the dielectrically-loaded parallel plates the distance between the parallel plates has to be less than $\lambda_d/2$, which for silicon at 10 GHz is ~4.5 mm, at 100 GHz this reduces to 450 µm. In practice to minimise the volume of plasma generated and the plasma generation/extinction times a 100 µm distance between the silicon substrate parallel plates has been used across the frequency range 5 to 30 GHz. Within the same frequency range plasma generating elemental cells of ~100 (µm diameter have been fabricated with the separation between adjacent elements of a few 100 µm. A typical solid state reflector at 10 GHz might a few hundred elemental cells and have a length of a ~40 mm. At 10 GHz the plasma generating MMIC might be 30 mm in diameter or ~1 wavelength in air. The size of device will depend on the frequency operation and the number of RF ports. For an EM wave to transit into and out of the parallel plate an aperture $\lambda_d/2$ is required, which at 10 GHz is ~4.5 mm, which for a circular parallel plate device allows a maximum of 16 ports for a 24 mm diameter.

Figure 16:
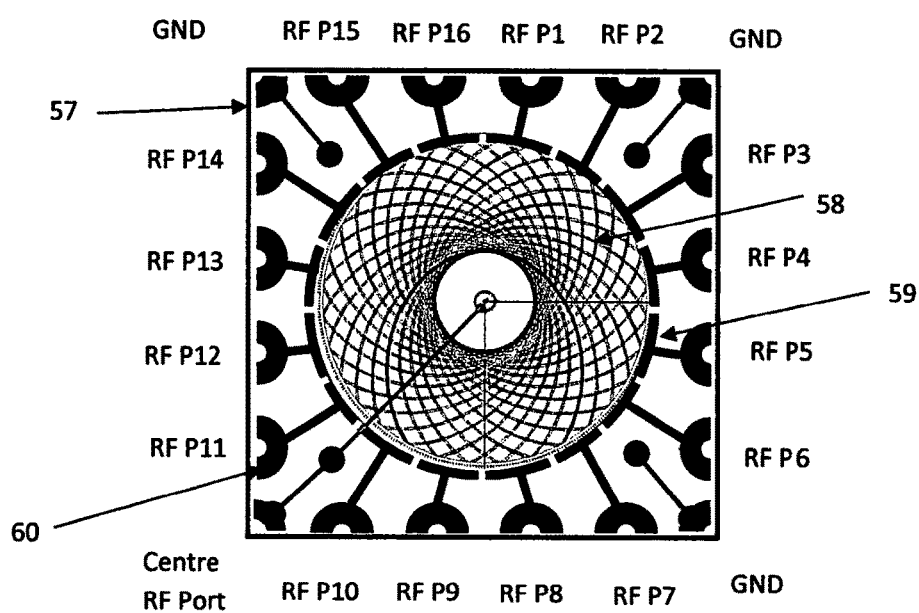
FIG. 16 shows a packaged solid state plasma MMIC device.

FIG. 16 illustrates how a solid state plasma MMIC, shown as an example only, in the form a 32 way commutator device 58, may be packaged within in a surface mount RF package 57, so facilitating incorporation on RF PCBs. The circular RF MMIC 58 is mounted directly on a small RF PCB or thick film ceramic circuit 59 with printed radial RF tracks 60. Solder bump or wire-bonds may form the RF interconnection as described above, in relationship to FIG. 14. The radial tracks may be implemented as micro-strip or co-planar lines and contain any parallel plate to line matching transitions circuitry, (e.g. stepped transformers or tapered lines, not shown). A flip-chip control device mounted inside the RF package may be connected directly to the solid state plasma MMIC, with its control and DC power, lines connected through another layer of RF bonding to external ports around the sides or possibly underneath the package (not shown).

It is to be appreciated that the embodiments of the invention described above with reference to the accompanying drawings have been given by way of example only and that modifications may be effected. Individual components shown in the drawings are not limited to use in their drawings and they may be used in other drawings and in all aspects of the invention.

The invention claimed is:

1. A solid state plasma monolithic microwave integrated circuit having single or multiple elemental devices with at least three terminals operating within the microwave, millimeter wave or terahertz bands, that can be configured within a parallel plate structure, which solid state plasma monolithic microwave integrated circuit comprises:

(i) a semiconductor dielectric substrate;

(ii) parallel plates which comprise an upper conducting parallel plate and a lower conducting parallel plate, and which parallel plates are used to guide an electromagnetic wave;

(iii) an isolating trench which is between the parallel plates, and which is used to contain a solid state plasma;

(iv) a distinct p-doped region and a distinct n-doped region which are within a first semiconductor region defined by the isolating trench below the upper conducting parallel plate, and which are connected to two electrical bias terminals, where at least one electrical bias terminal forms a radio frequency short to the upper parallel plate; and (v) a p or n doped region within a second semiconductor region defined by the isolating trench above the lower conducting parallel plate and connected to a third electrical bias terminal, where the third electrical bias terminal forms a radio frequency short to the lower conducting parallel plate, and wherein;

(vi) a solid state plasma is able to be controlled by voltage biasing of the three electrical bias terminals to either reflect, absorb or transmit an electromagnetic wave.

2. A solid state plasma monolithic microwave integrated circuit according to claim 1 in which the solid state material is high resistivity silicon.

3. A solid state plasma monolithic microwave integrated circuit according to claim 1 in which the elemental devices are arranged individually so as to follow a set of geometric curves approximating to a continuous reflecting surface.

4. A solid state plasma monolithic microwave integrated circuit according to claim 1 and which is configured to follow a sequence of temperature compatible silicon processing stages applied to a high resistivity silicon wafer which progressively creates the radio frequency monolithic microwave integrated circuit.

5. A solid state plasma monolithic microwave integrated circuit according to claim 4 in which the silicon processing is divided into five successive processing stages of:

(a) preparation of a silicon wafer to facilitate future processing and efficient parallel plate operation;

(b) fabrication of isolated plasma devices on silicon wafers;

(c) fabrication of multi-layer metal to allow an interconnect between the plasma generating devices and to create the radio frequency device ports;

(d) etching of the silicon wafer and subsequent backside metallisation to form a parallel plate radio frequency structure; and (e) precision cutting of the silicon wafer to produce isolated plasma beam-forming devices.

6. A solid state plasma monolithic microwave integrated circuit according to claim 5 in which a silicon-on-insulator wafer is configured as a high resistivity device wafer and a handle wafer which have been anodically bonded with a separating layer of silicon dioxide that is able to be used as chemical or reactive ion etch stop.

7. A solid state plasma monolithic microwave integrated circuit according to claim 6 in which the upper and lower surfaces of the device wafer have been selectively amorphised to create a pattern of treated circular regions suitable for the subsequent fabrication of annular elemental plasma devices, so as to reduce the degree of accumulation of surface charge and thereby reduce the ohmic losses associated with parallel plate, silicon dielectric waveguide operation surrounding the elemental plasma devices.

8. A solid state plasma monolithic microwave integrated circuit according to claim 7 in which the upper and lower surfaces of the device wafer have been selectively amorphised by ion bombardment, or by selective deposition of amorphised silicon.

9. A solid state plasma monolithic microwave integrated circuit according to claim 7 in which a buried layer under the silicon dioxide layer in the device wafer has been selectively doped in circular regions to facilitate future fabrication of circular ohmic contact associated with the elemental devices.

10. A solid state plasma monolithic microwave integrated circuit according to claim 9 in which a dry etch process was used to create an annular trench around elemental devices under fabrication, followed by the deposition of a high resistivity oxide layer on the walls of the trench to minimise the electron-hole surface recombination rate when a solid state plasma is generated, succeeded by the filling of the trench with amorphous silicon or polysilicon to re-establish mechanical integrity of the device wafer.

11. A solid state plasma monolithic microwave integrated circuit according to claim 10 in which surface PiN diodes are formed from an outer implanted region surrounding an inner implanted region, concentric with and inside cylindrical walls of the isolating trench.

12. A solid state plasma monolithic microwave integrated circuit according to claim 1 in which a first layer of metal is deposited to form the top of a parallel plate waveguide and selectively etched then covered with an insulating layer which is also selectively etched to allow a second interconnecting layer of metal to be applied that connects the solid state plasma elements in adjacent groups, on which an additional layer of selectively etched insulating material and a third metal layer are added to further connect groups of elements together and to bonding pads, and in which the interconnection is in series, parallel or a combination of both.

13. A solid state plasma monolithic microwave integrated circuit according to claim 12 in which the handle wafer has been removed leaving the insulating silicon dioxide layer of the device wafer which has been further etched to expose the doped regions within the elemental devices to allow metallisation which forms the lower parallel plate and ohmic contact to the plasma elemental devices.

14. A solid state plasma monolithic microwave integrated circuit according to claim 12 in which the handle wafer has been amorphised to reduce surface charge and has been selectively removed to expose the doped regions within the elemental devices to allow metallisation which forms the lower parallel plate with raised ohmic contact to the plasma elemental devices.

15. A solid state plasma monolithic microwave integrated circuit according to claim 1 in which the wafer is laser cut, cleaved or core drilled to produce individual dice.

16. A solid state plasma monolithic microwave integrated circuit according to claim 15 in which a control device is directly integrated to a radio frequency monolithic microwave integrated circuit die.

17. A solid state plasma monolithic microwave integrated circuit according to claim 16 in which the control device, which can simultaneously bias connected groups of elemental plasma devices to form regions of reflectivity, transparency and absorbency with the parallel plate monolithic microwave integrated circuit, is connected to the pads of the radio frequency monolithic microwave integrated circuit using flip chip and solder bump technologies.

18. A solid state plasma monolithic microwave integrated circuit according to claim 17 in which a radio frequency circuit load is interfaced to the parallel plate monolithic microwave integrated circuit to provide radio frequency ports.

19. A solid state plasma monolithic microwave integrated circuit according to claim 18 in which the plasma radio frequency monolithic microwave integrated circuit, the control chip and the radio frequency printed circuit board are able to be encapsulated within a single surface mount package.

20. A solid state plasma monolithic microwave integrated circuit according to claim 19 and which is for use in radio frequency commutators, high linearity switches, fast beamformers, electronically controllable time delays, tuneable filters and smart antennas.

* * * * *